United States Patent
Inazumachi et al.

(10) Patent No.: US 6,838,646 B2
(45) Date of Patent: Jan. 4, 2005

(54) SUSCEPTOR DEVICE

(75) Inventors: Hiroshi Inazumachi, Tokyo (JP); Mamoru Kosakai, Tokyo (JP)

(73) Assignee: Sumitomo Osaka Cement Co., Ltd. (JP)

( * ) Notice: Subject to any disclaimer, the term of this patent is extended or adjusted under 35 U.S.C. 154(b) by 0 days.

(21) Appl. No.: 10/644,292

(22) Filed: Aug. 20, 2003

(65) Prior Publication Data

US 2004/0065259 A1 Apr. 8, 2004

(30) Foreign Application Priority Data

Aug. 22, 2002 (JP) .......................... 2002-242310

(51) Int. Cl.[7] .............. H05B 3/68; G23C 16/00
(52) U.S. Cl. .................... 219/444.1; 118/724
(58) Field of Search ............... 219/444.1, 544, 219/390, 391; 118/724, 725, 728; 392/416, 418

(56) References Cited

U.S. PATENT DOCUMENTS

| | | | | |
|---|---|---|---|---|
| 5,290,381 A | * | 3/1994 | Nozawa et al. | 156/345.27 |
| 5,567,267 A | * | 10/1996 | Kazama et al. | 156/345.27 |
| 5,851,298 A | * | 12/1998 | Ishii | 118/728 |
| 6,084,215 A | * | 7/2000 | Furuya et al. | 219/444.1 |
| 6,538,872 B1 | * | 3/2003 | Wang et al. | 361/234 |

FOREIGN PATENT DOCUMENTS

| | | |
|---|---|---|
| JP | 2001313331 | 11/1901 |
| JP | 8162519 | 6/1996 |
| JP | 9045757 | 2/1997 |
| JP | 10032239 | 2/1998 |
| JP | 10270540 | 10/1998 |
| JP | 2002184851 | 6/2002 |

* cited by examiner

*Primary Examiner*—Sang Y. Paik
(74) *Attorney, Agent, or Firm*—Ostrolenk, Faber, Gerb & Soffen, LLP

(57) ABSTRACT

A susceptor device comprises a susceptor base body, a temperature controlling section, an adhesive layer which attaches the susceptor base body and the temperature controlling section unitarily, an O-ring which is disposed near a peripheral section of the adhesive layer, a circular O-ring which is disposed on a bottom surface of the temperature controlling section, an O-ring supporting section which surrounds the temperature controlling section and compresses the O-rings on the temperature controlling section, and pushup screws which push up and fix the O-ring supporting section toward the temperature controlling section. By doing this, it is possible to protect the adhesive layer from an external environment. Also, it is possible to provide a susceptor device having a superior temperature controlling characteristics for the plate sample, operational stability, and durability.

8 Claims, 3 Drawing Sheets

SUSCEPTOR DEVICE

BACKGROUND OF THE INVENTION

1. Field of the Invention

Present invention relates to a susceptor device which is preferably used for fixing a plate sample such as a silicon wafer in a semiconductor manufacturing device for manufacturing a semiconductor device such as an IC (Integrated Circuit), LSI (Large Scale Integration), and a VLSI (Very Large Scale Integration). In particular, the present invention relates to a susceptor device which can maintain a temperature in a plate sample which is mounted on a mounting surface in the susceptor device at a predetermined temperature efficiently such that the susceptor device does not cause a contamination to the plate sample nor generates a particle with a superior durability.

2. Description of Related Art

Conventionally, for example, a susceptor base body is used for a member for mounting the plate sample when various processes are performed to the plate sample such as a silicon wafer in processes for manufacturing a semiconductor device such as an IC, an LSI, and a VLSI.

When an etching process is performed to the plate sample, for example, under a plasma atmospheric condition, there occurs a problem in that a temperature of a surface of the plate sample becomes high by a plasma heat; thus, a resist layer on the surface bursts. In order to deal with this problem, a susceptor device is used in which a temperature controlling section in which a flow path for circulating a temperature controlling medium is formed is attached unitarily to a bottom surface of the susceptor base body on which the plate sample is mounted so as to exchange a heat by circulating a cooling medium in the flow path in the temperature controlling section and maintain the temperature of the plate sample at a predetermined temperature desirably.

FIG. 5 is a cross section of an example for such a susceptor device. Here, a susceptor device 1 comprises a ceramic susceptor base body 2 of which upper surface is a mounting surface 2a for mounting a plate sample, an electrode 3 which is disposed inside of the susceptor base body 2, a power supplying terminal 5 which is disposed in a fixing hole 4 in the susceptor base body 2 and connected to the electrode 3, a temperature controlling section 6 which is disposed beneath the susceptor base body 2 so as to support the susceptor base body 2 from downward having a flow path 6a for circulating medium such as a cooling medium thereinside. The susceptor base body 2 and the temperature controlling section 6 are attached unitarily via an adhesive layer 7 which is made of a cementing agent which contains a soft blazing filler metal such as an Indium and an Indium alloy.

The power supplying terminal 5 is connected to a high frequency power supply 11 which is disposed thereoutside and a direct current power supply 13 and a condenser 12 via coils 14 respectively.

The electrode 3 is any one among an electrostatic absorbing electrode, a plasma generating electrode, or an electrode which can serve as an electrostatic absorbing electrode and a plasma generating electrode compatibly.

However, in a conventional susceptor device 1 which is explained above, the adhesive layer 7 for attaching the susceptor base body 2 and the temperature controlling section 6 unitarily does not have a sufficient durability to a corrosive gas or a plasma. Therefore, there is a concern that the adhesive layer 7 is always exposed to such a corrosive gas and a plasma; thus, the adhesive layer 7 becomes deteriorated. Thus, there is a problem in that a thermal conductivity in the adhesive layer 7 is deteriorated; thus, it is difficult to control a temperature in the plate sample at a desirable constant temperature.

Also, there is a concern that the plate sample is contaminated and a particle is generated because a peripheral section of the adhesive layer 7 is exposed; thus a heavy metal which is contained in the adhesive layer 7 evaporates easily.

Furthermore, there is a concern that an extraordinary electric discharge occurs in the adhesive layer 7 while the adhesive layer 7 is exposed to a plasma; thus an insulating characteristics in a cemented surface is destructed because the adhesive layer 7 is conductive. Therefore, there are concerns not only that a safety device starts so frequently that the susceptor device can not hardly be operated stably but also that a stability in the susceptor device cannot be sufficient even if the susceptor device is operated stably.

SUMMARY OF THE INVENTION

The present invention was made so as to solve the above problems. An object of the present invention is to provide a susceptor device having a superior characteristics for control a temperature in the plate sample by protecting an adhesive layer which attaches the base body on which the plate sample is mounted and a temperature controlling section for controlling the temperature in the base body unitarily from an external environment. An object of the present invention is to provide a susceptor device which does not contaminate the plate sample and generates a particle, nor generates an extraordinary electric discharge with a stable operation and a durability.

As a result of elaborate research and development by the Inventors of the present invention, it is found that it is possible to solve the above problems effectively by protecting the adhesive layer which attaches the base body and the temperature controlling section unitarily by an O-ring; thus, this invention was made desirably.

That is, a susceptor device according to the present invention is characterized in comprising a ceramic base body having a mounting surface for mounting a plate sample on a surface of the ceramic base body, and a temperature controlling section for supporting the base body, in which a flow path for circulating a medium for controlling a temperature is formed. In this aspect of the present invention, it is also preferable that the base body and the temperature controlling section are attached together via an adhesive layer, and the adhesive layer is sealed by a sealing member which is disposed near a peripheral section of the adhesive layer.

In the susceptor device, the adhesive layer is sealed by a sealing member; thus, the adhesive layer is protected from an external environment such as a corrosive gas and a plasma. Therefore, there is no concern that the adhesive layer becomes deteriorated, or a dielectric breakdown is caused. By doing this, it is possible to maintain a thermal conductivity between the temperature controlling section and the plate sample desirably; thus, it is possible to control a temperature in the plate sample at a desirable constant temperature; thus, a temperature-controlling-characteristics in the plate sample can be enhanced.

Also, the adhesive layer is sealed by the sealing member for protecting the adhesive layer; therefore, there is no concern that the plate sample is contaminated or a particle is generated, an extraordinary electric discharge occurs. Thus, an operational stability in the susceptor device can be enhanced.

Furthermore, there is no concern that the adhesive layer causes the dielectric breakdown; thus, it is possible to realize a superior durability in the adhesive layer.

It is preferable that an electrode is disposed inside of the base body.

It is preferable that at least a main portion of the temperature controlling section is formed by a conductive material, and the temperature controlling section serves as an electrode.

It is preferable that a supporting section for supporting the sealing member is disposed outside of a peripheral section of the temperature controlling section, the supporting section is fixed by a fixing member on the temperature controlling section, and the sealing member is attached to the base body, or the adhesive layer, or the base body and the adhesive layer by compressing the sealing member by the supporting section.

By doing this, the adhesive layer is sealed by the sealing member reliably in a simple structure. Also, it is possible to maintain a thermal conductivity between the temperature controlling section and the plate sample desirably; thus, a temperature-controlling characteristics in the plate sample can be enhanced.

Also, there is no concern that the plate sample is contaminated or a particle is generated, an extraordinary electric discharge occurs. Thus, an operational stability in the susceptor device can be enhanced, and a durability of the adhesive layer can be enhanced further.

It is preferable that a groove for supporting the sealing member is formed on an upper surface of the supporting section.

Also, it is preferable that an inclined surface is formed on an upper end section in an inner peripheral surface of the supporting section such that the inclined surface has a predetermined angle to the inner peripheral surface, and the sealing member is attached to the base body, or the adhesive layer, or the base body and the adhesive layer by the inclined surface compressing the sealing member.

By disposing such an inclined surface, a force which is applied to the base member in a compressing operation is dispersed in a direction orthogonal to the base body and in a direction horizontal to the base body. An orthogonal force serves for removing the adhesive layer; therefore, by dispersing the force which is applied to the base body in two directions, it is possible to alleviate the force in the orthogonal direction. By doing this, there is no concern that the adhesive layer is removed from the base body or the temperature controlling section, or from both of them.

It is preferable that a ring flange section for supporting the sealing member is formed in a peripheral section of the base body.

It is preferable that a flange section which contacts a part of the sealing member is formed in an inner peripheral section of the supporting section, a second supporting section which contacts other part of the sealing member is disposed so as to face the flange section, the second supporting section is fixed to the supporting section by a second fixing member, and the sealing member is attached to the base body, or the adhesive layer, or the base body and the adhesive layer by the second supporting section and the flange section by compressing the sealing section.

By doing this, there is no concern that the force which is applied in a compressing operation is applied to the base body because such a force is received by the flange section. By doing this, a force is not applied in a direction in which the adhesive layer is removed; therefore, therefore, there is no concern that the adhesive layer is removed from the base body or the temperature controlling section, or from both of them.

As explained above, according to the susceptor device of the present invention, the base body and the temperature controlling section are attached unitarily via the adhesive layer, and the adhesive layer is sealed by a sealing member which is disposed near a peripheral section of the adhesive layer. Therefore, it is possible to protect the adhesive layer from an external environment such as a corrosive gas and a plasma. Thus, there is no concern that the adhesive layer is deteriorated or the dielectric breakdown is caused. Therefore, it is possible to maintain a thermal conductivity between the temperature controlling section and the plate sample desirably and control the temperature in the plate sample at a desirable constant temperature, and enhance the temperature-controlling-characteristics in the plate sample.

Also, there is no concern that the plate is not contaminated and a particle is generated. Also, it is possible to prevent a dielectric breakdown and enhance an operational stability.

Also, a supporting section for supporting the sealing member is disposed outside of the peripheral section of the temperature controlling section, and the supporting section is fixed in the temperature controlling section by a fixing member. Simultaneously, the sealing member is attached to the base body or the adhesive layer, or both of them by the supporting section. By doing this, it is possible to seal the adhesive layer in a simple structure reliably.

Also, an inclined surface is formed on an upper end section in an inner peripheral surface of the supporting section such that the inclined surface has a predetermined angle to the inner peripheral surface, and the sealing member is attached to the base body, or the adhesive layer, or the base body and the adhesive layer by the inclined surface compressing the sealing member. By doing this, it is possible to disperse a force which is applied to the base body in two directions; therefore, there is no concern that cementing agent layer is removed from the base body or the temperature controlling section, or from both of them.

Also, a ring flange section for supporting the sealing member is formed in a peripheral section of the base body, and a flange section which contacts a part of the sealing member is formed in an inner peripheral section of the supporting section, a second supporting section which contacts other part of the sealing member is disposed so as to face the flange section, the second supporting section is fixed to the supporting section by a second fixing member, and the sealing member is attached to the base body, or the adhesive layer, or the base body and the adhesive layer by the second supporting section and the flange section by compressing the sealing section. By doing this, the flange section receives a force which is applied to the base body in a compressing operation; thus, it is possible to prevent a force from being applied to the base body. Therefore, there is no concern that a force does not serve in a direction for removing the adhesive layer; thus, there is no concern that the adhesive layer is removed from the base body or the temperature controlling section, or from both of them.

DETAILED DESCRIPTION OF THE INVENTION

Embodiments of the susceptor according to the present invention are explained with reference to an electrostatic absorbing susceptor device.

Here, it should be understood that the drawings and detailed description thereto are not intended to limit the invention to the particular form disclosed, but to help better understanding features in the present invention.

First Embodiment

Figure 1:
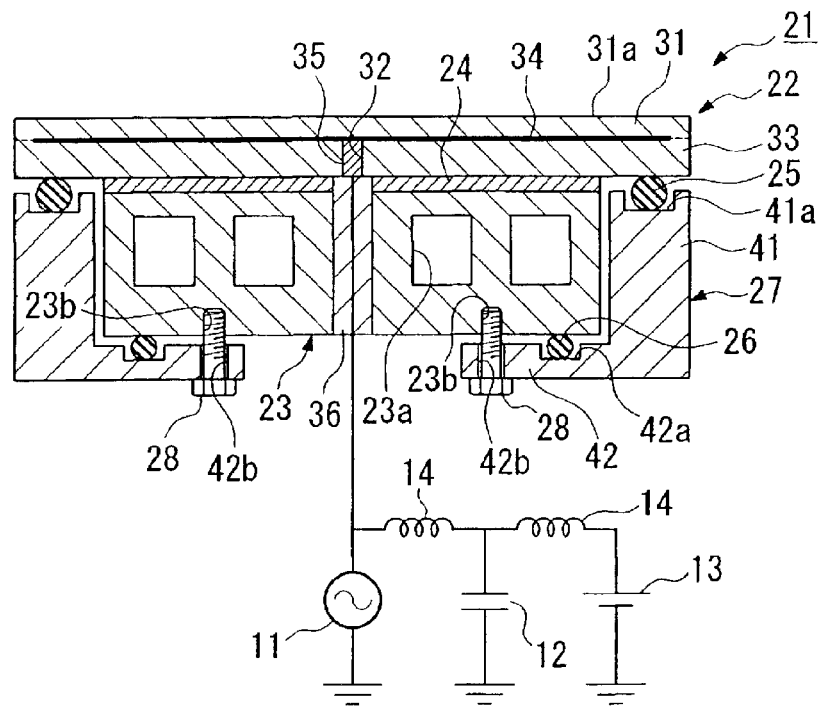
FIG. 1 is a cross section of a susceptor device according to a first embodiment of the present invention.

FIG. 1 is a cross section of a susceptor device according to a first embodiment of the present invention. In the drawing, the susceptor 21 comprises an electrostatic absorbing susceptor base body 22, a temperature controlling section 23 which is disposed beneath the susceptor base body 22 so as to support the susceptor base body 22 from downward, an adhesive layer 24 which attaches the susceptor base body 22 and the temperature controlling section 23 unitarily, a circular O-ring (sealing member) 25 which is disposed near a peripheral section of the adhesive layer 24, a circular O-ring (sealing member) 26 which is disposed on a bottom surface of the temperature controlling section 23, an O-ring supporting section 27 which is disposed so as to surround a peripheral section of a round surface of the temperature controlling section 23 and a peripheral section of a bottom surface of the temperature controlling section 23 so as to compress the O-rings 25, 26 to the temperature controlling section 23, a plurality of, such as two to twelve pieces of pushup screws (fixing member) 28 which pushes up and fixes the O-ring supporting section 27 toward the temperature controlling section 23.

The susceptor base body 22 comprises a circular mounting plate 31 in which an upper surface (a principal plane) of the circular mounting plate 31 is a mounting surface 31a for mounting a plate sample, a circular supporting plate 33 having a fixing hole 32 which penetrates through the mounting plate 31 which is attached with the mounting plate 31 unitarily, an electrostatic absorbing inner electrode 34 which is formed between the mounting plate 31 and the supporting plate 33, and a power supplying terminal 35 which is formed in the fixing hole 32 so as to be attached to the electrostatic absorbing inner electrode 34.

The mounting plate 31 and the supporting plate 33 have the same shape such that the mounting plate 31 and the supporting plate 33 exactly overlap each other when attached together. The mounting plate 31 and the supporting plate 33 are made of a ceramic. For such a ceramic, it is preferable to use either one among an aluminium nitride, an aluminium oxide, a silicon nitride, a silicon oxide, a zirconium oxide, a titanium oxide, SIALON, a boron nitride, and a silicon carbide, or a composite ceramic which contains a plurality of members among them above.

Here, it is acceptable if a member which forms the mounting plate 31 and the supporting plate 33 may be a single member or a composite member. It is preferable to use a member which can be sintered easily. Also, it is preferable the member has a thermal expansion coefficient which is as close as that of the electrostatic absorbing inner electrode 34. Also, a mounting surface 31a on the mounting plate 31 is supposed to serve as an electrostatic absorbing surface; therefore, it is preferable to use a member having a high dielectric constant so as not to become an impurity for plate sample having an electrostatic absorbing characteristics.

It is preferable that a thickness of the mounting plate 31 is in a range of 0.1 to 5 mm. In particular, a range of 0.2 to 2 mm is preferable. This is because that, if thickness is smaller than 0.1 mm, it is not possible to realize a sufficient durability for voltage, and if thickness is greater than 5 mm, an electrostatic absorbing characteristics decreases. In addition, a thermal conductivity between the plate sample which is mounted on the mounting surface 31a and the temperature controlling section 23 decreases; thus, it is difficult to maintain a temperature of the plate sample under processes at a desirable constant temperature.

The thickness of the supporting plate 33 is not limited particularly. Usually, the thickness of the supporting plate 33 is in a range of 1 to 30 mm. This is because that, if the thickness of the supporting plate 33 is smaller than 1 mm, it is not possible to realize a sufficient strength, and if the thickness is greater than 30 mm, a thermal conductivity between the plate sample which is mounted on the mounting surface 31a and the temperature controlling section 23 decreases; thus, it is difficult to maintain a temperature of the plate sample under processes at a desirable constant temperature.

These mounting plate 31 and the supporting plate 33 are attached unitarily not via a cementing agent therebetween.

That is, an insulating layer which is made of the same member as the mounting plate 31 and the supporting plate 33 is disposed between the mounting plate 31 and the supporting plate 33 such that the insulating layer does not overlap the electrostatic absorbing inner electrode 34 on the supporting plate 33. The mounting plate 31 and the supporting plate 33 are attached together and processed thermally under a compressed condition. Thus, the mounting plate 31 and the supporting plate 33 are attached unitarily. Here, it is acceptable if the insulating layer is made of a member having the same main ingredient as that of the mounting plate 31 and the supporting plate 33.

Therefore, a corrosive gas and a plasma do not enter from a cemented surface between the mounting plate 31 and the supporting plate 33. Thus, there is no concern that the plate sample is contaminated and a particle is generated. In addition, it does not occur that the electrostatic absorbing inner electrode 34 is exposed to the plasma and an extraordinary electric discharge happens.

A shape of the electrostatic absorbing inner electrode 34 is determined according to whether it is a unipolar electrostatic absorbing device or a bipolar electrostatic absorbing device.

For a member for forming an electrostatic absorbing inner electrode 34, it is possible to use a metal having a high melting point such as a titanium, a tungsten, a molybdenum, and a platinum, or a conductive ceramics such as a graphite, an amorphous carbon (carbon), a silicon carbide, a titanium nitride, and a titanium carbide. It is preferable that a thermal expansion coefficient of these member for forming the electrode should be as close as possible to the thermal expansion coefficient in the mounting plate 31 and the supporting plate 33.

It is preferable that the thickness of the electrostatic absorbing inner electrode 34 should be in a range of 0.01 to 200 $\mu$m. In particular, it is preferable that the thickness of the electrostatic absorbing inner electrode 34 should be in a range of 0.1 to 100 $\mu$m. This is because that, if the thickness of the electrostatic absorbing inner electrode 34 is smaller than 0.01 μm, it is not possible to realize a sufficient electric conductivity, and if the thickness is greater than 200 μm, it may occur that the mounting plate 31 and the supporting plate 33 may be removed from each other easily. Also, the thermal conductivity between the plate sample which is mounted on the mounting plate 31 and the temperature controlling section 23 may decrease; thus, it is difficult to maintain the temperature of the plate sample under processes at a desirable constant temperature. An electrostatic absorbing inner electrode 34 having such thickness can be formed by commonly know methods such as sputtering method, vapor deposition method, printing method easily.

A power supplying terminal 35 is disposed so as to apply a voltage to the electrostatic absorbing inner electrode 34. Quantity and shape of the power supplying terminal 35 is determined whether the electrostatic absorbing inner electrode 34 is a unipolar electrostatic absorbing device or a bipolar electrostatic absorbing device.

A material for the power supplying terminal 35 is not limited to a specific material as long as it is electrically conductive. It is preferable that the thermal expansion coefficient of the power supplying terminal 35 should be as close as possible to that in the supporting plate 33 and the electrostatic absorbing inner electrode 34. In particular, various conductive ceramics is preferable.

The temperature controlling section 23 is formed in a circular plate of which diameter is smaller than that of the susceptor base body 22 and thickness of the temperature controlling section 23 is thicker than that of the susceptor base body 22. In the temperature controlling section 23, a flow path for circulating a cooling medium is formed. An upper surface of the temperature controlling section 23 is attached to a bottom surface of the supporting plate 33 of the susceptor base body 22 unitarily via the adhesive layer 24. On the other hand, a screw hole 23b is formed on a bottom surface of the temperature controlling section 23 so as to engage a pushup screw 28. Also, the power supplying terminal 35 is surrounded by an insulating member 36 and penetrates the temperature controlling section 23.

In the temperature controlling section 23, a cooling medium having a predetermined temperature is supplied to the flow path 23a from a cooling device which is not shown in the drawing via a pipe. By doing this, the susceptor is cooled such that the temperature in the susceptor 22 does not exceed the predetermined temperature at which the O-rings 25, 26 are durable to a heat. Such a predetermined temperature is, for example, 200° C.

A material for forming the temperature controlling section 23 is not limited to a specific material as long as it has a superior thermal conductivity and formability. For example, it is possible to name a metal such as a copper, an aluminium, a titanium, a stainless steel, or a composite material made of a metal such as an aluminium and ceramics such as an aluminium-silicon-carbide-composite ceramics which contains 20 to 70 weight % of a silicon carbide.

It is preferable that a coating made of an alumilite should be performed to an overall surface of the temperature controlling section 23 which is exposed to at least a plasma. By performing a coating process by using an alumilite, an anti-plasma characteristics in the temperature controlling section 23 can be enhanced. In addition, an anti-plasma stability (an extraordinary electric discharge prevention) can be enhanced. Furthermore, it is possible to prevent a damage on a surface of the temperature controlling section 23.

A material (a cementing agent or a bonding agent) for forming the adhesive layer 24 is not limited to a specific material as long as it can attach the supporting plate 33 and the temperature controlling section 23 strongly. For such a member for forming the adhesive layer 24, it is possible to name a bonding agent containing a silicon, or a flexible organic bonding agent made of a bonding agent containing a fluorocarbon polymer such as a polytetrafluoroethylene. Also, it is possible to use a soft blazing filler such as an Indium or an Indium alloy preferably.

O-rings 25, 26 seal the adhesive layer 24 so as to protect the adhesive layer 24 from a corrosive gas such as $CF_4$, $WF_6$, and $SF_6$ and a plasma of these members. A member for forming the O-rings 25, 26 is not limited to a specific material as long as it can protect the adhesive layer 24 from a corrosive gas and a plasma. It is preferable to use a member which has a superior anti-corrosion characteristics, an anti-plasma characteristics, and a heat resistance. For such a material, it is possible to name a fluorocarbon polymer such as a polytetrafluoroethylene. For example, it is possible to use an O-ring which is named as CHEMRAZ as a product of Green Tweed and Company Japan Limited.

The O-ring supporting section 27 comprises a cylindrical supporting section main body 41 which is disposed so as to surround a round surface of the temperature controlling section 23 and a flat circular plate flange section 42 which is formed so as to be unitary with the supporting section main body 41 so as to be directed toward an axial center from a bottom end of the supporting section main body 41. A circular groove 41a is formed on an upper surface of the supporting section main body 41 so as to support the O-ring 25. Also, a circular groove 42a is formed on an upper surface of the flat circular plate flange section 42 so as to support the O-ring 26. Furthermore, a hole 42b is formed so as to inert the pushup screw 28 therethrough.

A material for the O-ring supporting section 27 is not limited to a specific material. For such a material for the O-ring supporting section 27, it is preferable to use either one among an aluminium nitride, an aluminium oxide, a silicon nitride, a silicon oxide, a zirconium oxide, a titanium oxide, SIALON, a boron nitride, and a silicon carbide. Also, it is preferable to use a metal such as a copper, an aluminium, a titanium, or a stainless steel. Furthermore, it is preferable to use or a composite ceramic which is made of a metal such as an aluminium and ceramics such as an aluminium-silicon-carbide-composite ceramics which contains 20 to 70 weight % of silicon carbide.

A material for the pushup screw 28 is not limited to as specific material. It is preferable to use an approximately the same material as the material which forms the O-ring supporting section 27.

Here, if an anti-corrosion characteristics and an anti-plasma characteristics in the O-ring supporting section 27 are not sufficient, it is preferable that a coating made of an alumilite should be performed to an overall surface of the O-ring supporting section 27 which is exposed to at least a plasma. Alternatively, it is preferable that a resin coating made of a polyimide resin should be performed to an overall surface of the O-ring supporting section 27.

The O-ring supporting section 27 is disposed so as to surround a peripheral section of a round surface of the temperature controlling section 23 and a peripheral section of a bottom surface of the temperature controlling section 23 under condition that the O-ring 25 is engaged to the groove 41a and the O-ring 26 is engaged to the groove 42a; thus, the pushup screw 28 is inserted in the hole 42b so as to be engaged in a screw hole 23b. Under such a condition, a force which is caused while the pushup screw 28 is engaged is applied upwardly; thus, the O-ring supporting section 27 is pushed toward the temperature controlling section 23.

Simultaneously, the O-ring 25 which is engaged at the groove 41a is compressed on a bottom surface of the supporting plate 33. Similarly, the O-ring 26 which is engaged at the groove 42a is compressed on a bottom surface of the temperature controlling section 23. By doing this, the adhesive layer 24 is sealed by the O-rings 25, 26 and the O-ring supporting section 27; thus, the adhesive layer 24 is protected from a corrosive gas and a plasma.

The O-rings 25, 26 and the O-ring supporting section 27 which are formed by the above materials have a sufficient durability to a corrosive gas such as $CF_4$, $WF_6$, and $SF_6$ and a plasma of these members. Also, the O-rings 25, 26 and the O-ring supporting section 27 have a superior thermal resistance; thus, it is possible to protect the adhesive layer 24 from a corrosive gas and a plasma.

As explained above, in the susceptor device 21 according to the present embodiment, the susceptor base body 22 and the temperature controlling section 23 are attached unitarily via the adhesive layer 24; therefore, a thermal conductivity between the temperature controlling section 23 and the plate sample is maintained; thus, it is possible to control the temperature of the plate sample at a desirable constant temperature.

Also, the adhesive layer 24 is sealed by the O-rings 25, 26 and the O-ring supporting section 27; thus, the adhesive layer 24 is protected from a corrosive gas and a plasma. Therefore, there is no concern that the plate sample is contaminated and a particle is generated by the adhesive layer 24. Also, the adhesive layer 24 has a sufficient durability to a corrosive gas and a plasma; therefore, it does not occur that the adhesive layer 24 is exposed to a plasma and an extraordinary electric discharge happens. Thus, it is possible to improve a durability in the electrostatic absorbing device.

Second Embodiment

Figure 2:
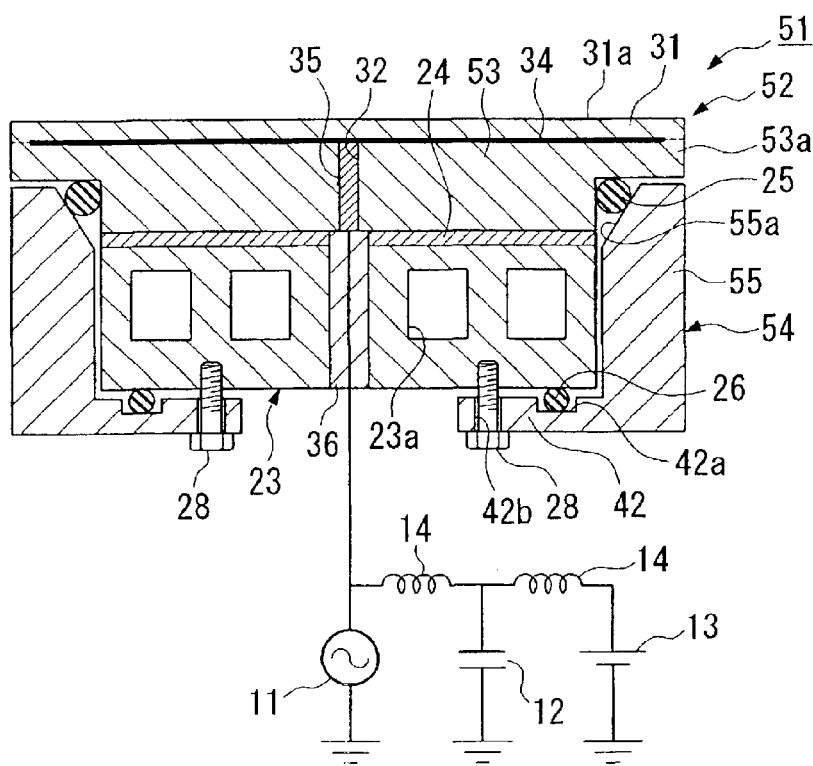
FIG. 2 is a cross section of a susceptor device according to a second embodiment of the present invention.

FIG. 2 is a cross section of a susceptor device according to a second embodiment of the present invention. A susceptor device 51 in the present embodiment differs from the susceptor device 21 according to the first embodiment in following features. That is, a supporting plate 53 in a susceptor base body 52 is formed in a circular plate having a thicker thickness than that of the supporting plate 33 according to the first embodiment. Also, a circular flange section 53a is formed on a bottom peripheral section of the supporting plate 53 so as to support the O-ring 25. An inclined surface 55a is formed on an innerwise upper surface of the cylindrical supporting section main body 55 of the O-ring supporting section 54 such that the inclined surface 55a has a predetermined inclination to the innerwise upper surface. Furthermore, the O-ring 25 is compressed on the supporting plate 53 on the susceptor base body 52 by the inclined surface 55a.

The rest of the features in the second embodiment are the same as those in the first embodiment; thus, explanations in detail are omitted.

In the susceptor device 51, a flange section 53a is formed on a bottom peripheral section of the supporting plate 53 so as to support the O-ring 25, an inclined surface 55a is formed on an innerwise upper surface of the supporting section main body 55 of the O-ring supporting section 54. Also, the O-ring 25 is compressed on the supporting plate 53 of the susceptor base body 52 by the inclined surface 55a. By doing this, a force which is caused while the pushup screw 28 is engaged is applied upwardly; thus, a force which is applied to the supporting plate 53 in a compressing operation is dispersed in a direction orthogonal (vertical direction in the drawing) to the supporting plate 53 and in a horizontal direction (horizontal direction in the drawing). As a result, a force in a vertical direction is alleviated.

The force in such a vertical direction serves in a direction for removing the adhesive layer 24; thus, there is no concern that the adhesive layer 24 is removed from both of the supporting plate 53 and the temperature controlling section 23 by alleviating the force in the vertical direction.

It is possible to realize the same function and the same effect by the susceptor device 51 according to the present embodiment as the function and the effect in the susceptor device 21 according to the first embodiment.

In addition, a force which compresses the O-ring 25 on the supporting plate 53 is alleviated by engaging the O-ring supporting section 54 at the temperature controlling section 23 by screwing the pushup screw 28; therefore, it does not occur that the adhesive layer 24 is broken by such a compressing force.

Third Embodiment

Figure 3:
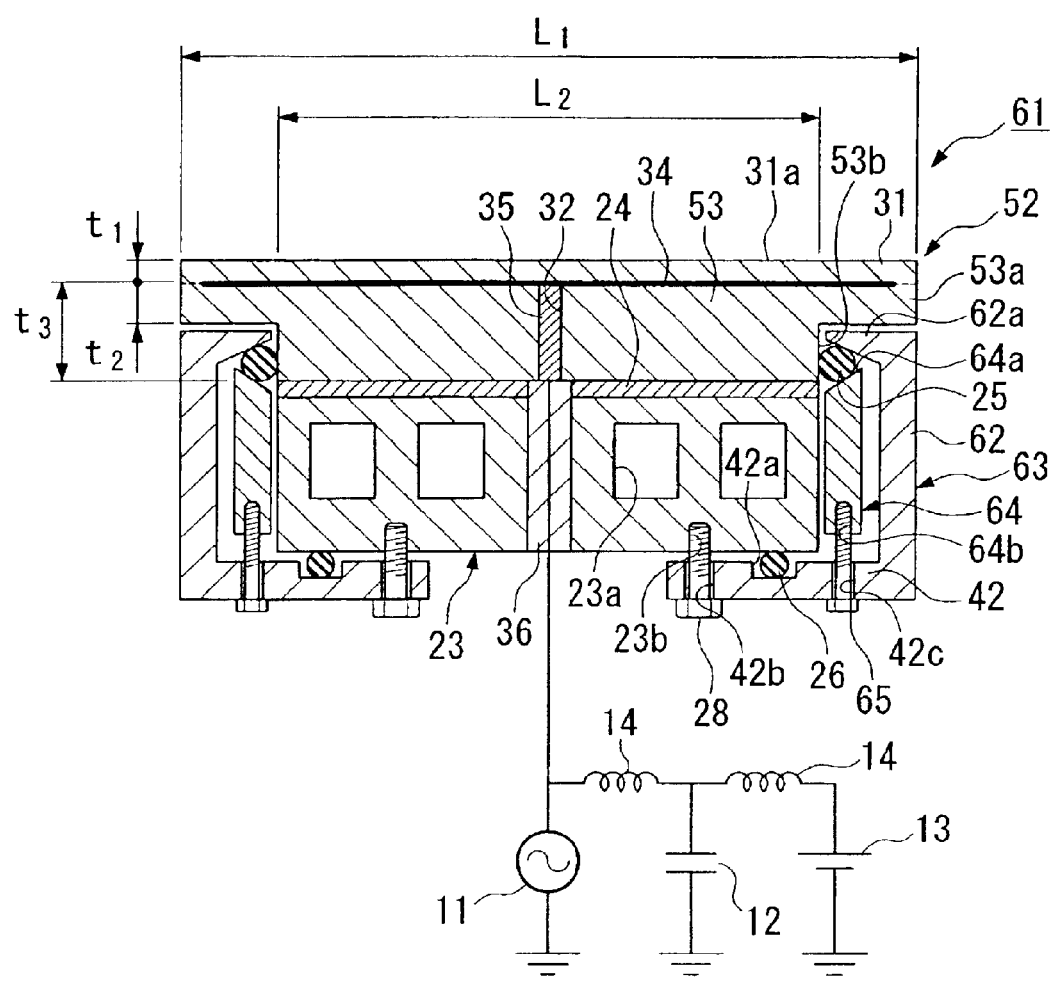
FIG. 3 is a cross section of a susceptor device according to a third embodiment of the present invention.

FIG. 3 is a cross section of a susceptor device according to a third embodiment of the present invention. A susceptor device 61 in the present embodiment differs from the susceptor device 51 according to the second embodiment in that an O-ring supporting section comprises an O-ring supporting section 63 which has a supporting section main body 62 which has a flange section 62a which has an inclined surface which contacts a part of the O-ring 25 on an innerwise upper surface of the flange section 62a so as to compress the O-ring 25 from behind diagonally, a (second) O-ring supporting section 64 which is disposed inside of the supporting section main body 52 coaxially and has an inclined surface 64a which inclines around an axial center at a predetermined inclination angle on an upper cylindrical end of the (second) O-ring supporting section 64, a pushup screw (second fixing member) 65 which pushes up the O-ring supporting section 64 upwardly so as to compress the flange section 62a and the O-ring 25 on a round surface 53b of the supporting plate 53.

The rest of the features in the third embodiment are the same as those in the second embodiment; thus, explanations in detail are omitted.

In the susceptor device 61, O-rings 63, 64 are disposed so as to surround a peripheral sections of a round surface and a bottom surface of the temperature controlling section 23 under condition that the O-ring 26 is engaged at a groove 42a, an O-ring 26 is sandwiched by a flange section 62a of the O-ring supporting section 63 and an inclined surface 64a of the O-ring supporting section 64. In addition, after a pushup screw 28 is inserted through a hole 42b, the pushup screw 28 is engaged at a screw hole 23b. Also, a pushup screw 65 is inserted through a hole 42c, and the pushup screw 65 is engaged at a screw hole 64b.

A force which is generated in a compressing operation to the O-ring 25 is received at an inclined surface of the flange section 62a. Simultaneously, such a force compresses the O-ring 25 in an axial direction by an inclined surface of the flange section 62a and an inclined surface 64a of the O-ring supporting section 64; thus the O-ring 25 is compressed to be attached on a round surface 53b of the supporting plate 53.

As explained above, there is no concern that a force is not applied to the supporting plate 53 when the O-ring 25 is compressed to be attached on the supporting plate 53; therefore, a force does not serve in a direction in which the adhesive layer 24 is removed. Therefore, there is no concern that the adhesive layer 24 is removed from both of the supporting plate 53 and the temperature controlling section 23.

It is possible to realize the same function and the same effect by the susceptor device 61 according to the present embodiment as the function and the effect in the susceptor device 51 according to the second embodiment.

In addition, the O-ring 25 is sandwiched by the flange section 62a of the O-ring supporting section 63 and the inclined surface 64a of the O-ring supporting section 64; therefore, a force which is generated when the O-ring 25 is compressed does not serve in a direction in which the adhesive layer 24 is removed. Therefore, there is no concern that the adhesive layer 24 is broken by such a compressing force.

Fourth Embodiment

Figure 4:
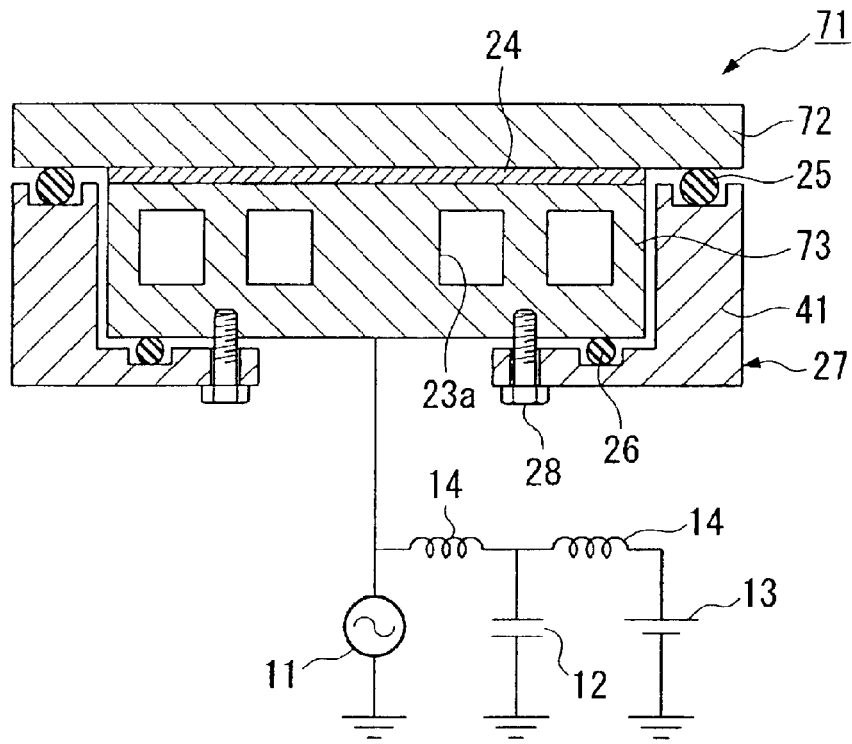
FIG. 4 is a cross section of a susceptor device according to a fourth embodiment of the present invention.
Figure 5:
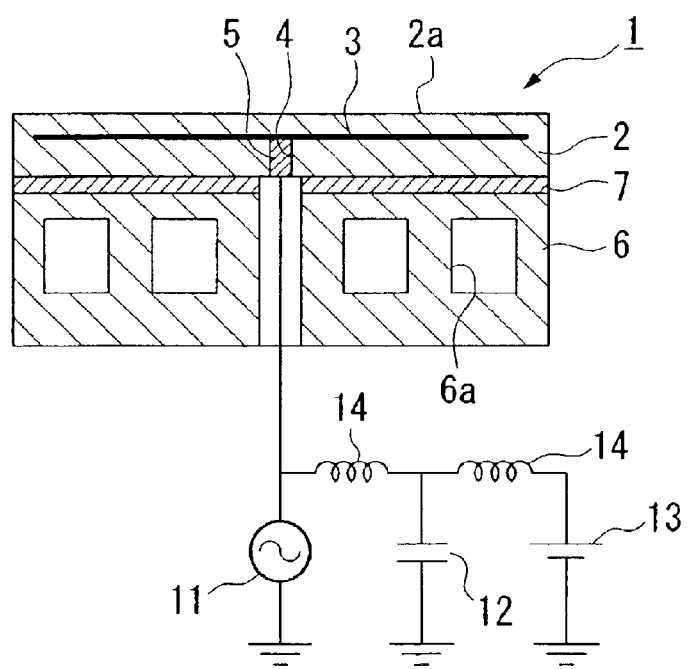
FIG. 5 is a cross section for an example for a conventional susceptor device.

FIG. 4 is a cross section of a susceptor device according to a fourth embodiment of the present invention. A susceptor device 71 is different from the susceptor device 21 according to the first embodiment in following aspects. That is, a susceptor base body 72 is made of a ceramic which is selected among aluminium nitride, an aluminium oxide, a silicon nitride, a silicon oxide, a zirconium oxide, a titanium oxide, SIALON, a boron nitride, and a silicon carbide, or a ceramic plate which does not have an inner electrode which is made of a composite ceramic which contains a plurality of members among them above. Also, a temperature controlling section 73 is formed by a conductive metal such as a copper, an aluminium, a titanium, and a stainless steel so as to serve as an inner electrode. Furthermore, the susceptor main body 72 and the temperature controlling section 73 are attached unitarily by the adhesive layer 24.

The rest of the features in the fourth embodiment are the same as those in the first embodiment; thus, explanations in detail are omitted.

It is possible to realize the same function and the same effect by the susceptor device 71 according to the present embodiment as the function and the effect in the susceptor device 21 according to the first embodiment.

In addition, a structure of the susceptor base body 72 is simplified because the susceptor base body 72 is formed by a piece of ceramic plate which does not have an inner electrode, and the temperature controlling section 73 is made of a conductive material so as to serve as an inner electrode. Therefore, an overall structure of the susceptor device 71 can be simplified; thus, there is an effect in that maintenance and repair can be performed easily.

The present invention is explained in more detail with reference to example of embodiments and comparison examples as follows. Here, a susceptor device 61 according to the third embodiment shown in FIG. 3 is manufactured.

Manufacturing a Susceptor Base Body

First, an electrostatic absorbing susceptor base body 52 which comprises the mounting plate 31 for mounting a plate sample thereon, a supporting plate 53 which is attached with the mounting plate 31 unitarily, an electrostatic absorbing electrode 34 which is disposed between the mounting plate 31 and the supporting plate 53, and a power supplying terminal 35 which is disposed so as to penetrate through the supporting plate 53 and contact the electrostatic absorbing inner electrode 34 is manufactured as follows. Here, the susceptor base body 52 is used in both the example of embodiments and the comparison embodiments in common.

Manufacturing a Mounting Plate

A circular sintered-alumina member having 230 mm of diameter $L_1$ and 1 mm of thickness $t_1$ is manufactured according to a commonly known method. Next, a main plane (mounting plate) the sintered-alumina member is ground until a flatness of the main plane satisfies 10 $\mu$m or smaller; thus, a mounting plate 31 is manufactured.

Manufacturing a Supporting Plate

An alumina-sintered member which has a cross section in which a diameter L1 is 230 mm, a diameter L2 is 200 mm, a thickness t2 is 2 mm, and a thickness t3 is 5 mm as shown in FIG. 3, and has a flange section around a peripheral section of the alumina-sintered member is manufactured according to a commonly know method. Next, a fixing hole (diameter: 2.5 mm) 32 is made by using a diamond drilling device on the alumina-sintered member so as to assemble a power supplying terminal 35 to be fixed thereat.

Manufacturing a Power Supplying Terminal

A mixture of a 70 weight % of an alumina powder and 30 weight % of a tungsten powder is molded and sintered. A conductive bar sintered member which can be fixed in the fixing hole 32 in the supporting plate 53 which becomes the power supplying terminal 35 is obtained.

Attaching Unitarily

The power supplying terminal 35 is pushed into the fixing hole 32 which is formed in the above supporting plate 53 so as to be fixed thereat. Next, a member to be applied which contains a mixture of a 70 weight % of an alumina powder and 30 weight % of a tungsten powder is applied on the supporting plate 53 according to a screen printing method such that the member to be applied becomes an inner electrode in a thermal processing step under a compressed condition later. The applied member on the supporting plate 53 is dried; thus, a layer for forming an electrostatic absorbing inner electrode is obtained.

Also, a member to be applied which contains an alumina powder is applied except the layer for forming an electrostatic absorbing inner electrode on the supporting plate 53 according to the screen printing method. The applied member on the supporting plate 53 is dried; thus, a layer for forming an insulating layer is obtained.

Next, the supporting plate 53 and the mounting plate 31 are attached so as to overlap each other such that the layer for forming an electrostatic absorbing inner electrode and a layer for forming an insulating layer are sandwiched therebetween and a ground surface of the mounting plate 31 is disposed upwardly. After that, a thermal processing operation is performed by a hot-pressing apparatus under a compressed condition to the supporting plate 53 and the mounting plate 31 unitarily which are attached each other; thus, an electrostatic absorbing susceptor base body 52 is obtained.

Manufacturing a Temperature Controlling Section

Next, a temperature controlling section which is used for an example of embodiment and a comparison example is manufactured.

A powder mixture of 15 weight % of a silicon carbide and 85 weight % of an aluminium is casted in a sand mold; thus, a temperature controlling section 23 which is made of a circular Al-composite member of which diameter is 200 mm and which thickness is 20 mm is manufactured. A flow path 23a is formed in the temperature controlling section 23 which is made of an Al-composite member for circulating a cooling medium.

Attaching a Susceptor Base Body and a Temperature Controlling Section Unitarily

Next, a cemented surface in the temperature controlling section 23 is degreased and cleaned by using an organic solvent such as an acetone. A blazing filler which has 100 weight % of indium so as to become an adhesive layer is applied on the degreased and cleaned surface. After that, a thermal processing step is performed to the blazing filler under condition of 200° C. of atmosphere; thus, a blazing filler having 100 $\mu$m thickness is manufactured. After that, the susceptor base body 52 which is manufactured in the above step is mounted on the blazing filler. Consequently, a heating operation is performed to the susceptor base body 52 which is mounted on the blazing filler under condition of 200° C. of atmosphere. Such a blazing filler layer becomes the adhesive layer 24. Simultaneously, the temperature controlling section 23 and the susceptor base body 52 are attached unitarily via the adhesive layer 24. Furthermore, a silicon resin is filled between the power supplying terminal 35 and the temperature controlling section 23 so as to insulate the power supplying terminal 35 from the temperature controlling section 23.

A susceptor device which is used for both the example of embodiments and the comparison example is manufactured as follows.

Example of Embodiments

Manufacturing an O-ring Supporting Member

O-ring supporting sections 63, 64 which are made of an alumina-sintered member shown in FIG. 3 are manufactured according to a method which is explained in the above "Manufacturing a temperature controlling section".

Manufacturing a Susceptor Device

O-rings 63, 64 are disposed so as to surround a peripheral sections of a round surface and a bottom surface of the temperature controlling section 23 under condition that the O-ring 26 is engaged at a groove 42a, an O-ring 26 is sandwiched by a flange section 62a of the O-ring supporting section 63 and an inclined surface 64a of the O-ring supporting section 64. In addition, after a pushup screw 28 is inserted through a hole 42b, the pushup screw 28 is engaged at a screw hole 23b. Also, a pushup screw 65 is inserted through a hole 42c, and the pushup screw 65 is engaged at a screw hole 64b. By doing this, a susceptor device 61 which is used for an example of the embodiment is manufactured.

For the O-rings 25, 26, O-rings which are made of a fluoride resin are used. Here, O-rings which are made of a material named as CHEMRAZ E38 as a product of Green Tweed and Company Japan Limited are used.

Comparison Example

A susceptor which has the same structure as the susceptor which is manufactured for the example of the embodiment except that the temperature controlling section is not surrounded by the O-rings 25, 26 is prepared for a comparison example.

Evaluation

Silicon wafers (plate samples) which has 200 mm diameter are mounted on the mounting surfaces in the susceptor for the example of the embodiment and in the susceptor for the comparison example respectively. Electric currents having 500V voltage, 750V voltage, 1000V voltage are charged to the electrostatic absorbing inner electrodes in these susceptors while flowing a water (cooling medium) in flow paths in the temperature controlling sections such that surface temperatures of the silicon wafers are at 400° C. under a plasma atmospheric condition which contains argon (Ar) gas so as to absorb the silicon wafers on the mounting surfaces electrostatically.

Results of evaluation for the example of the embodiment and evaluation for the comparison example are shown in TABLE 1.

TABLE 1

|  | Voltage to be charged (V) | Electric Current (mA) | Electrostatic Absorption (kPa) |
| --- | --- | --- | --- |
| Example of Embodiment | 500 | 0.02 | 7 |
|  | 750 | 0.05 | 9 |
|  | 1000 | 0.15 | 11 |
| Comparison Example | 500 | 0.02 | 7 |
|  | 750 | 0.05 | 9 |
|  | 1000 | Discharge | — |

According to the above evaluations, it is understood that it is possible to absorb the silicon wafer electrostatically under any voltage condition in the susceptors for the examples of the embodiments satisfactorily. In contrast, it is understood that an electric discharge occurs in a section of the adhesive layer 34 which is exposed thereoutside under condition that a voltage which is charged is 1000V in a case of the susceptor for the comparison example; thus, a safety device starts; therefore, it is not possible to absorb the silicon wafer electrostatically successfully.

What is claimed is:

1. A susceptor device comprising:

a ceramic base body having a mounting surface for mounting a plate sample on a surface of the ceramic base body; and a temperature controlling section for supporting the base body, in which a flow path for circulating a medium for controlling a temperature is formed;

wherein the base body and the temperature controlling section are attached together via an adhesive layer; and the adhesive layer is sealed by a sealing member which is disposed near a peripheral section of the adhesive layer.

2. A susceptor device according to claim 1 wherein an electrode is disposed inside of the base body.

3. A susceptor device according to claim 1 wherein:

at least a main portion of the temperature controlling section is formed by a conductive material; and the temperature controlling section serves as an electrode.

4. A susceptor device according to claim 1 wherein:

a supporting section for supporting the sealing member is disposed outside of a peripheral section of the temperature controlling section;

the supporting section is fixed by a fixing member on the temperature controlling section; and the sealing member is attached to the base body, or the adhesive layer, or the base body and the adhesive layer by compressing the sealing member by the supporting section.

5. A susceptor device according to claim 4 wherein a groove for supporting the sealing member is formed on an upper surface of the supporting section.

6. A susceptor device according to claim 4 wherein:

an inclined surface is formed on an upper end section in an inner peripheral surface of the supporting section such that the inclined surface has a predetermined angle to the inner peripheral surface; and the sealing member is attached to the base body, or the adhesive layer, or the base body and the adhesive layer by the inclined surface compressing the sealing member.

7. A susceptor device according to claim 6 wherein a ring flange section for supporting the sealing member is formed in a peripheral section of the base body.

8. A susceptor device according to claim 4 wherein:

a flange section which contacts a part of the sealing member is formed in an inner peripheral section of the supporting section;

a second supporting section which contacts other part of the sealing member is disposed so as to face the flange section;

the second supporting section is fixed to the supporting section by a second fixing member and, the sealing member is attached to the base body, or the adhesive layer, or the base body and the adhesive layer by the second supporting section and the flange section by compressing the sealing section.

* * * * *